United States Patent
Redeker et al.

(10) Patent No.: US 8,403,727 B1
(45) Date of Patent: Mar. 26, 2013

(54) PRE-PLANARIZATION SYSTEM AND METHOD

(75) Inventors: Fred C. Redeker, Fremont, CA (US); John M. Boyd, Atascadero, CA (US); Yezdi Dordi, Palo Alto, CA (US); Sabir A. Majumder, Fremont, CA (US); Simon McClatchie, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 2151 days.

(21) Appl. No.: 10/816,417

(22) Filed: Mar. 31, 2004

(51) Int. Cl.
*B24B 1/00* (2006.01)
*B24B 7/19* (2006.01)
*B24B 7/30* (2006.01)

(52) U.S. Cl. .......................................... 451/57; 451/41

(58) Field of Classification Search ............... 451/41, 451/57
See application file for complete search history.

(56) References Cited

U.S. PATENT DOCUMENTS

| | | | | |
|---|---|---|---|---|
| 5,897,426 A | * | 4/1999 | Somekh | 451/41 |
| 5,913,712 A | * | 6/1999 | Molinar | 451/41 |
| 6,261,157 B1 | * | 7/2001 | Bajaj et al. | 451/57 |
| 6,315,634 B1 | * | 11/2001 | Jensen et al. | 451/5 |
| 6,376,335 B1 | * | 4/2002 | Zhang et al. | 438/471 |
| 6,435,942 B1 | * | 8/2002 | Jin et al. | 451/8 |
| 6,656,842 B2 | * | 12/2003 | Li et al. | 438/691 |
| 6,852,012 B2 | * | 2/2005 | Vepa et al. | 451/41 |
| 2003/0013387 A1 | * | 1/2003 | Tsai et al. | 451/41 |
| 2005/0009448 A1 | * | 1/2005 | Misra et al. | 451/5 |

* cited by examiner

*Primary Examiner* — Bryan R Muller
(74) *Attorney, Agent, or Firm* — Martine Penilla Group, LLP

(57) ABSTRACT

A method for producing a normalized surface on a substrate for a chemical mechanical planarization process is provided. The method initiates with grinding a surface of the substrate with a first surface associated with a first planarization length. The method includes planarizing the surface of the substrate with a second surface associated with a second planarization length. Here, the second planarization length being less than the first planarization length. A system for processing a semiconductor substrate is also provided.

8 Claims, 13 Drawing Sheets

PRE-PLANARIZATION SYSTEM AND METHOD

CROSS REFERENCE TO RELATED APPLICATION

This application is related to U.S. patent application Ser. No. 10/816,504 filed on the same day as the instant application and entitled "COMPLIANT GRINDING WHEEL," and U.S. patent application Ser. No. 10/816,418 filed on the same day as the instant application and entitled "COMPLIANT WAFER CHUCK." The disclosure of these related applications are incorporated herein by reference in their entirety for all purposes.

BACKGROUND OF THE INVENTION

1. Field of the Invention

The present invention relates generally to semiconductor manufacturing and, more particularly, to a method and apparatus for pre-planarizing a substrate in order to more efficiently perform a planarization operation.

2. Description of the Related Art

During copper interconnect manufacturing, a copper layer is deposited on a seed/barrier layer using an electroplating process. Components in the electroplating solution provide for appropriate gap fill on sub-micron features. However, these sub-micron features tend to plate faster than the bulk areas and larger, i.e., greater than 1 µm, trench regions. The sub-micron regions are typically found in large memory arrays such as, for example static random access memory (SRAM), and can comprise large areas of the wafer. It should be appreciated that this causes large area regions to have additional topography that must be planarized in addition to the larger trench regions that must also be planarized.

FIG. 1 is a simplified schematic diagram illustrating a silicon substrate having a copper layer deposited thereon. Copper layer 102 is deposited on a seed/barrier layer disposed over silicon wafer 100 using an electroplating process. As mentioned above, components in the electroplating solution provide for good gap fill on submicron features, such as sub-micron trenches in regions 104a and 104b, but these features tend to plate faster than the bulk areas and trench regions 106a-d. Steps or "lumps" in the topography of the substrate, illustrated by regions 108a and 108b, result over the sub-micron trench regions. Thus, these large area regions, which step up in the topography, must be planarized along with the topography over trench regions 106a-d. Exacerbating this situation is that silicon wafer 100 is typically associated with a waviness, i.e., is not perfectly flat.

Current planarization techniques are not suited to handle the resulting topography efficiently, i.e., the techniques are sensitive to pattern density and circuit layout. More specifically, CMP processes must be tuned dependent upon the incoming wafer properties. Changes are made to the CMP process, such as changing consumables (pad and slurry) used for the CMP processing, in order to accommodate variations within lots of wafers as well as different pattern densities and circuit layouts on wafers typical of mixed-product manufacturing lines. When attempting to perform a single CMP process on the topography without changing the consumables, excessive dishing and erosion occurs over trench regions 106a-d, in order to completely remove the copper from regions 108a and 108b. Additionally, not only must the CMP process remove the excess copper in regions 108a and 108b, but the CMP process must also perform this removal in a manner that follows the contour of the substrate. Current CMP processes do not suitably deal with both of these variables.

In view of the foregoing, there is a need for a method and apparatus that normalizes the surface of a substrate to be planarized in order to more efficiently perform planarization processes.

SUMMARY OF THE INVENTION

Broadly speaking, the present invention fills these needs by providing a method and apparatus for normalizing the surface of a substrate through a pre-planarization process. It should be appreciated that the present invention can be implemented in numerous ways, including as a method, a system, or an apparatus. Several inventive embodiments of the present invention are described below.

In one embodiment, a method for producing a normalized surface on a substrate for a chemical mechanical planarization process is provided. The method initiates with grinding a surface of the substrate with a first surface associated with a first planarization length. The method includes planarizing the surface of the substrate with a second surface associated with a second planarization length. Here, the second planarization length is less than the first planarization length.

In another embodiment, a method for preparing a surface of a substrate for a planarization process is provided. The method initiates with identifying a representative distance between protrusions extending from the surface of the substrate. Then a grinding surface is applied against the surface of the substrate. The grinding surface is associated with a planarization length corresponding to the representative distance. The method includes substantially removing the protrusions from the surface of the substrate.

In yet another embodiment, a system for processing a semiconductor substrate is provided. The system includes a pre-planarization module having a first planarization surface associated with a first planarization length. A chemical mechanical planarization (CMP) module positioned downstream from the pre-planarization module is included. The CMP module has a second planarization surface associated with a second planarization length. The second planarization length is less than the first planarization length.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1:
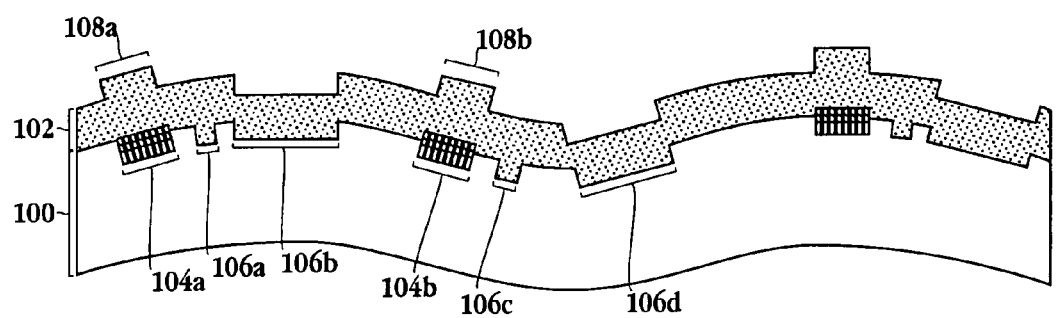
FIG. 1 is a simplified schematic diagram illustrating a silicon substrate having a copper layer deposited thereon.

An invention is described for a system, apparatus and method for producing a normalized surface in preparation for a chemical mechanical planarization (CMP) process. It will be obvious, however, to one skilled in the art, that the present invention may be practiced without some or all of these specific details. In other instances, well known process operations have not been described in detail in order not to unnecessarily obscure the present invention.

The embodiments of the present invention provide a system, apparatus, and method for performing a pre-planarization process in order to normalize a surface to be planarized. This normalization enables standardization of a subsequent planarization process. With this standardization, a number of benefits such as predictability, cost savings, etc., are realized. In one embodiment, the pre-planarization process is a grinding process which scratches the top surface, e.g., a copper layer, of the substrate. As used herein, the terms substrate and wafer are interchangeable.

The planarization length of the larger trenches on the substrate is typically less than a few hundred microns. As used herein, planarization length refers to the relative distance of the low region between associated features. For example, the distance between dense array areas, the top surface of the copper above the array being of a level higher than the copper overburden in the field region, represents one planarization length, while the width of larger trenches, the top surface of the copper inside the trench region having a level lower than the copper overburden in the field region represents another planarization length. Additionally, these larger trenches are generally uniformly distributed across the die and can easily be managed using conventional CMP processing techniques and consumables given a typical planarization length of less than 100 um. The array regions, however, can comprise a few large blocks of area in a die only, and thus have a planarization length somewhere in the order of the die size (about 2-20 millimeters (mm)). Thus, the larger trench regions are associated with a micron (µ) scale and frequency, while the array regions are associated with a millimeter scale and frequency. In one embodiment, the planarization process is partitioned where a pre-planarization process that is insensitive to die size, layout, and array size and pitch, i.e., the pre-planarization process is associated with a long planarization length of the order of the die size, is followed by a planarization process associated with a shorter planarization length. For example, a grinding wheel may be used for the pre-planarization process as described below. The grinding wheel may contain grinding teeth that are compliant in order to provide better contour following for substrates associated with a higher waviness and total thickness variation (TTV).

In one embodiment, the wafer is loaded in a grinding system (vacuum chuck to hold the wafer face-up) and a grinding wheel containing a diamond abrasive in a matrix is lowered to the wafer surface and mechanically removes the copper material. The grinding wheel may have a planarization length of about 100-200 mm or greater, and easily planarizes the superfilled regions above the arrays. One skilled in the art will appreciate that in-situ metrology to measure removal amount during grinding may be incorporated into the grinding system. Additionally, an in-situ grinding wheel dressing may be included in the system configuration.

In another embodiment, the grinding process produces scratches on the wafer surface that have a depth of less than about 0.25 um, and a width of less than about 2 um. These scratches can easily be planarized and removed during the subsequent short range planarization process. In yet another embodiment, an integrated CMP system can be configured with a pre-planarization module (either a grinding-type module or a sub-aperture single-wafer polisher using fixed-abrasive grinding media, to provide mechanical-only removal of the super-fill areas above the arrays). The short range planarization module may be any suitable conventional polish module, e.g., linear, rotary, orbital or electromechanical mechanical polishing units. It should be appreciated that this process then would enable the use of an abrasive-free slurry process to complete the planarization. The wafer could then use a plasma etch to remove the barrier layer. Alternatively, if a partial planarization was performed on these wafers using conventional slurry, a plasma etch-back of the pre-planarized copper from the second step and a final barrier removal may be performed.

Abrasive-free slurries, such as that produced by HITACHI, are formulated to remove copper and planarize the substrate. These slurries are highly selective due to a chemical change produced when the barrier is exposed during endpoint, thereby forming a galvanic couple between the copper and the tantalum barrier, and resulting in inhibition of the copper polish process. Thus, the process may be referred to as self-stopping. The abrasive-free slurries have demonstrated superior dishing and erosion characteristics. Previously, the presence of a puddle of copper remaining in the array regions, stopped the removal process before all the copper is cleared. Thus, the use of an abrasive-free slurry was rendered useless for many die layouts that have a moderate to high super-fill region thickness, such as the areas in SRAM regions.

Figure 2A:
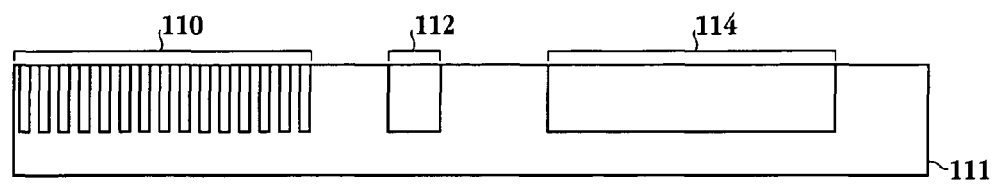
FIGS. 2A through 2D are schematic diagrams illustrating the topography associated with an electroplating copper process and the resulting inefficiencies caused when planarizing this topography.

FIGS. 2A through 2D are schematic diagrams illustrating the topography associated with an electroplating copper process and the resulting inefficiencies caused when planarizing this topography. In FIG. 2A, substrate 111 includes a region of sub-micron trenches 110 defined therein. In addition, larger trenches 112 and 114 are defined within substrate 111.

Figure 2B:
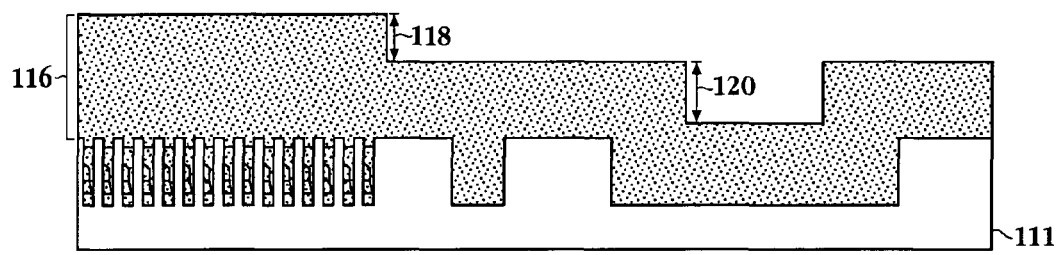
Figure 2C:
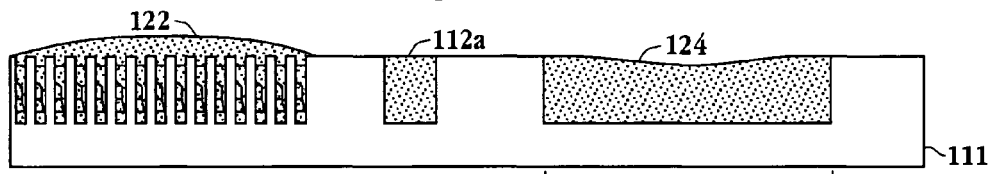
Figure 2D:
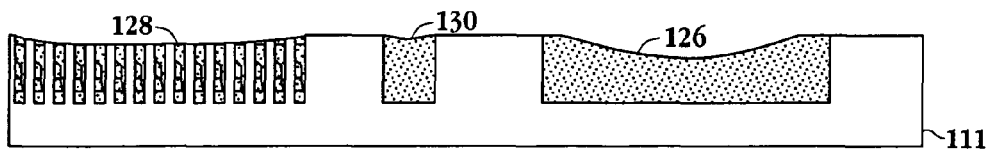

FIG. 2B illustrates the results of a copper electroplating process. Here, a super-fill area 116 above the sub-micron trenches is created having a step up in height as compared to the overburden in the field regions of the substrate. In one embodiment, the height illustrated by distance 118 is approximately 0.15 to 2.0 microns. As can be seen, a trench area having a depth 120 is defined above large trench 114, which was filled with copper during the electroplating process. FIG. 2C illustrates the results of a CMP process that bases its endpoint on the planarization process applied to filled trench 112a. As illustrated, while filled trench 112a has been planarized, the super-fill region retains an excessive amount of copper 122. At the same time, larger trench 114 experiences dishing and erosion effects as illustrated by surface 124. FIG. 2D illustrates the results of an overpolish applied to substrate 111 in order to clear the excess copper 122 over the sub-micron trenches, i.e., array region. It should be appreciated that each of the trench features of FIG. 2D experience dishing/erosion as a result of current CMP processes as shown by surfaces 126, 128, and 130.

Figure 3:
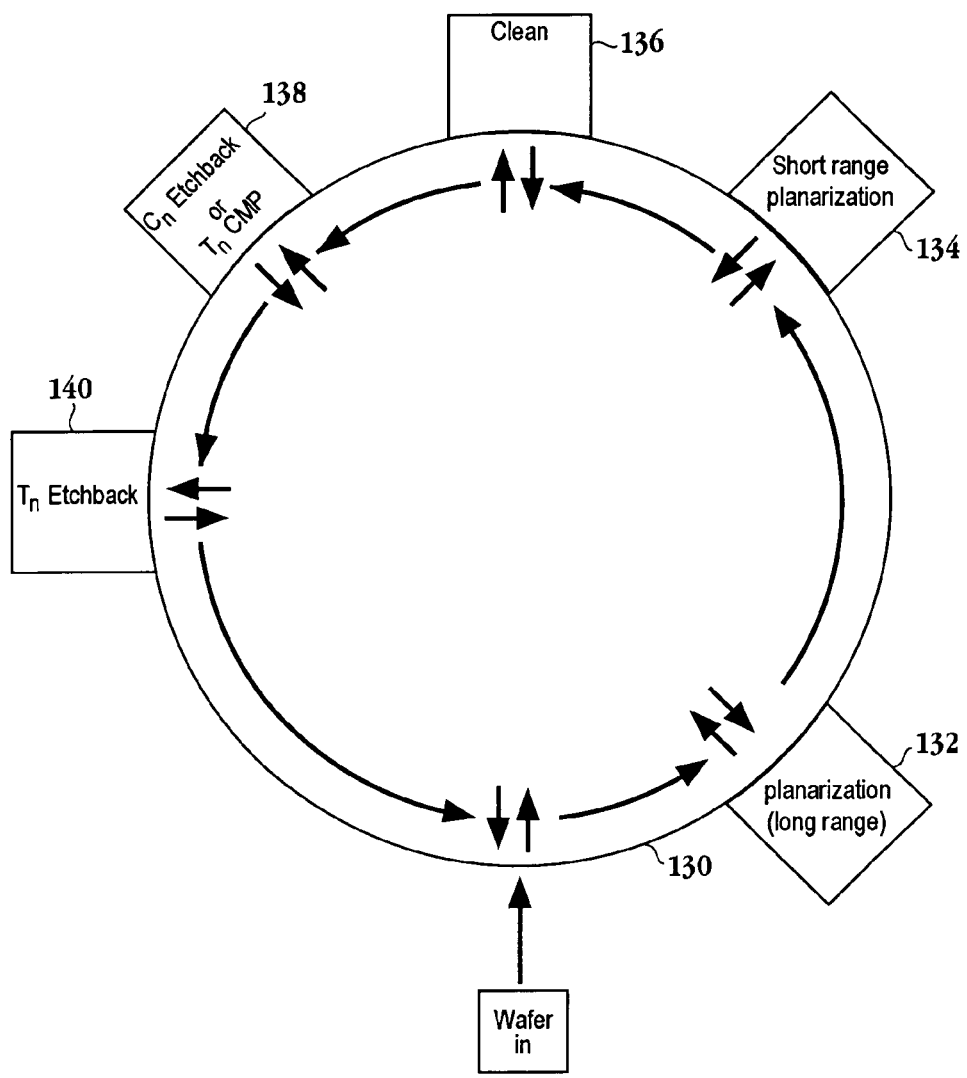
FIG. 3 is a simplified schematic diagram of a cluster tool for processing a semiconductor substrate in accordance with one embodiment of the invention.

FIG. 3 is a simplified schematic diagram of a cluster tool for processing a semiconductor substrate in accordance with one embodiment of the invention. Here, cluster tool 130 includes a plurality of modules. The modules include pre-planarization module 132, short range planarization module 134, clean module 136, copper etch back or tantalum CMP module 138 and tantalum etch back module 140. A wafer is introduced into cluster tool 130 and is delivered to pre-planarization module 132. Pre-planarization module 132 is configured to planarize the surface of a substrate according to a first planarization length. Here, the wafer may be loaded into a grinding system with a vacuum chuck used to hold the wafer face up. The grinding wheel contains a diamond abrasive surface in a matrix that is lowered to the wafer and mechanically removes the copper material, as discussed in more detail below. In one embodiment the grinding wheel has a planarization length of between about 100 and 200 millimeters. In another embodiment, the planarization length is greater than 200 millimeters.

The grinding wheel planarizes the super-filled regions above the sub-micron arrays. Thus, short-range planarization module 134 receives wafers having a normalized surface. Therefore, the consumables may be standardized according to the wafer type and an abrasive-free slurry may be applied as the erosion and dishing concerns are no longer an issue. Of course, in-situ metrology to measure removal amount during grinding may be incorporated here. In essence, the pre-planarization module normalizes the wafer/pattern types to a single post-grind surface. This post-grind surface may then be planarized through short-range planarization module 134. Here, the remaining copper thickness is polished to an endpoint in a conventional CMP process. It should be appreciated that short range planarization module 134 may be any suitable planarization system, e.g., an orbital CMP system, a belt type CMP system, an electrochemical CMP system, etc. As will be discussed in more detail below, the grinding process scratches the surface of the substrate leaving about a 0.1 to 0.2 micron scratch on the surface which is generally about two microns in width. One skilled in the art will appreciate that pre-planarization module 132 may include a grinding type operation or a sub-aperture single wafer polisher using fixed abrasive grinding media. An exemplary sub-aperture polishing system is disclosed in U.S. Pat. No. 6,585,572, which is herein incorporated by reference in its entirety for all purposes. Upon completion of the pre-planarization processing the substrate is transferred to short-range planarization module 134.

As a result of the normalization provided by the pre-planarization module 132, short-range planarization module 134 may now be standardized regardless of the incoming wafer type. Thus, it is conceivable that a single standardized process for short range planarization module 134 may be instituted regardless of the incoming wafer. Additional modules included in cluster tool 130 include clean module 136, which is configured to clean the substrate after the short range planarization process of module 134. Copper etch back, or alternatively tantalum CMP module 138 is also included. Tantalum etch back module 140 is also provided in cluster tool 130. One skilled in the art will appreciate that any number of alternative modules can be included in cluster tool 130 along with the pre-planarization module 132 and short range planarization module 134.

Figure 4:
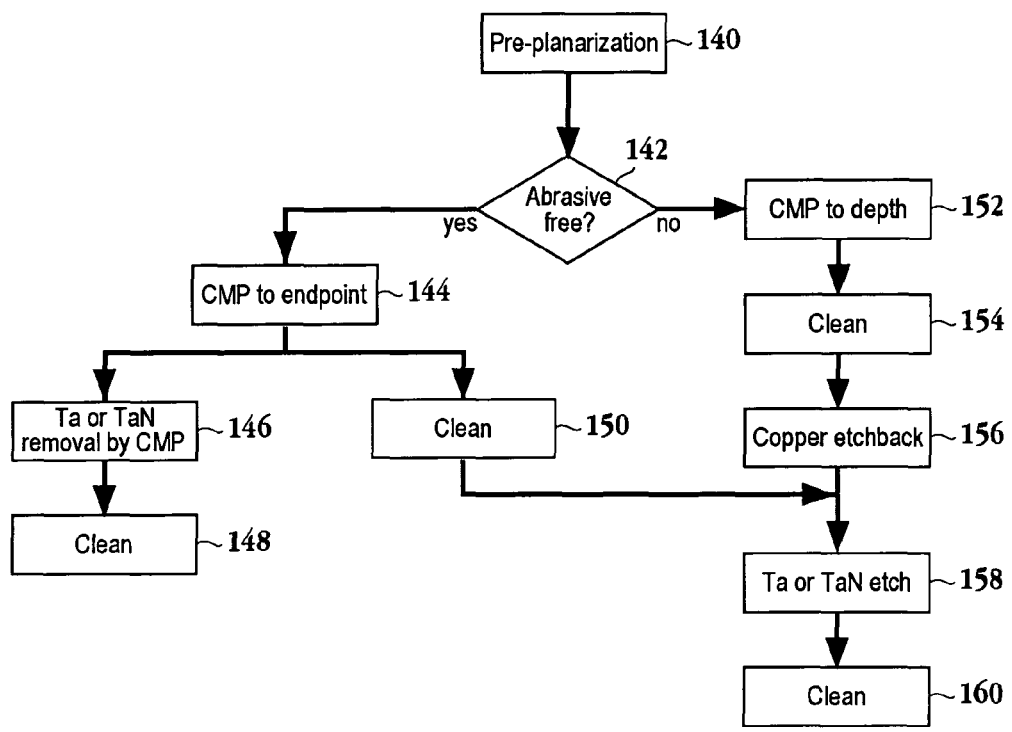
FIG. 4 is a flowchart diagram illustrating alternative method operations that may be incorporated downstream of the pre-planarization scheme in accordance with one embodiment of the invention.

FIG. 4 is a flowchart diagram illustrating alternative method operations that may be incorporated downstream of the pre-planarization scheme in accordance with one embodiment of the invention. The pre-planarization module may include a grinding module as discussed below. After pre-planarization in operation 140 it is decided whether to use an abrasive-free process in decision operation 142. If an abrasive-free process is not selected, then the method advances to operation 152 where a CMP process is performed to a certain depth. Here, feature removal and short-range planarization occurs following the pre-planarization in operation 140. Upon completion of the CMP operation to a certain depth, the method advances to operation 154 where a cleaning operation is performed. It should be appreciated that the cleaning operation may be any suitable cleaning operation configured to clean the processed wafer. Upon completion of cleaning operation 154, the method advances to operation 156 where a copper etch back is performed. Downstream from the copper etch back process is a tantalum or tantalum nitride etch process in operation 158, which is followed by cleaning operation 160. If an abrasive-free process is used in operation 142, then the method proceeds to operation 144 where a CMP process is performed to an endpoint. As mentioned above, abrasive free slurries available from HITACHI are exemplary slurries that may be used here. Upon obtaining the endpoint in operation 144 the method may proceed to either cleaning operation 150 or a tantalum/tantalum nitride removal by CMP in operation 146. Where the process moves to cleaning operation 150, the process will then advance to tantalum or tantalum nitride etch operation 158 and proceed as described above. Where the process moves to tantalum or tantalum nitride removal by CMP in operation 146, the next process sequence will be cleaning operation 148. Here again, cleaning operation 148 may be any suitable cleaning operation following a CMP operation.

One skilled in the art will appreciate that abrasive-free slurries are formulated to remove copper and planarize trenches. These abrasive-free slurries are highly selective due to a chemical change produced when the barrier is exposed during endpoint, in which a galvanic couple is formed between the copper and the tantalum. This results in inhibition of the copper polish process, i.e., the process becomes self-stopping. While these abrasive-free slurries have demonstrated superior dishing and erosion characteristics, their effectiveness has been limited with respect to conventional CMP processes. As mentioned above, the presence of a "puddle" of copper remaining in the array regions, i.e., the super-fill areas, limits the use of abrasive free slurries. That is, the exposure of the barrier in the trench regions stops the removal process before all the copper is cleared. Thus, the process is rendered unusable for many layouts that have a moderate to high super-fill region thickness. By incorporating the embodiments described herein, i.e., the pre-planarization processing, the abrasive free slurries are enabled to be used since the super-fill areas are substantially eliminated during the pre-planarization process.

Figure 5A:
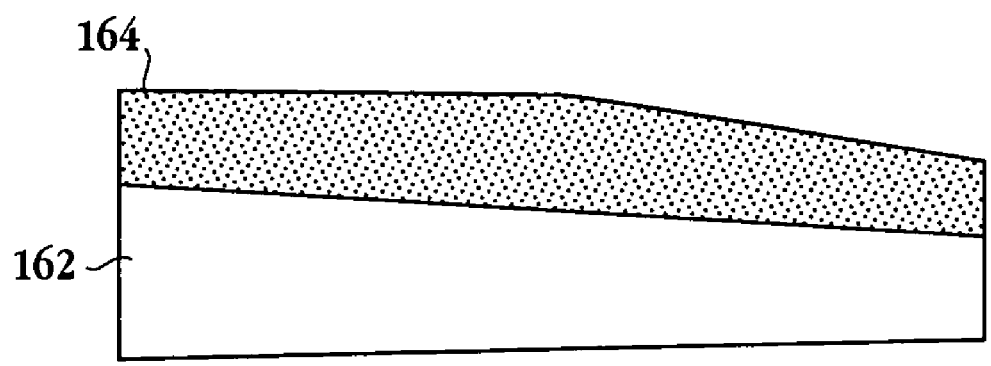
FIGS. 5A and 5B represent substrate portions having a copper layer disposed thereon.
Figure 5B:
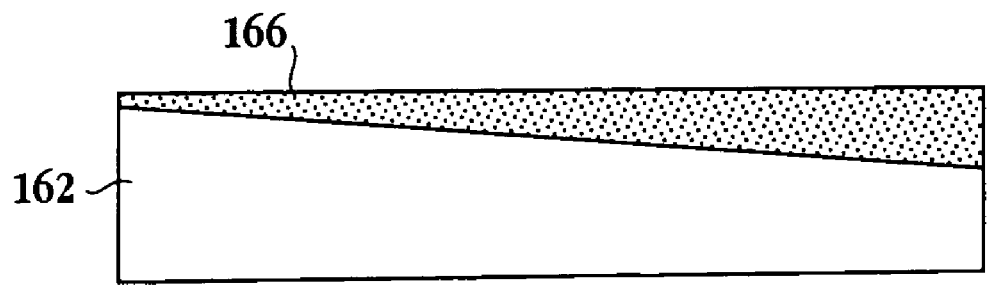

FIGS. 5A and 5B represent substrate portions having a copper layer disposed thereon. FIG. 5A, illustrates a substrate prior to grinding. Silicon substrate 162 has a copper layer 164 disposed thereon. As can be seen, silicon layer 162 is associated with a taper, i.e., one end of the substrate is thicker than another end. Here, as a tapered wafer experiences a grinding process, a reverse taper is introduced on the copper film, however, the total substrate is parallel. FIG. 5B illustrates the resulting reverse taper experienced through a grinding process where the wafer is supported with a non-compliant chuck. As can be seen, silicon substrate 162 retains its taper, however, as a result of the grinding process, copper layer 164 of FIG. 5A has been reduced to layer 166 in FIG. 5B. Layer 166 incorporates a reverse taper, thereby making the entire substrate, which includes silicon substrate 162 and copper layer 166, parallel. Another aspect of the invention described herein enables a grinding wheel to reference a backside of the wafer rather than a front side. This is achieved through the use of a compliant chuck as described with reference to FIGS. 6 and 7.

Figure 6:
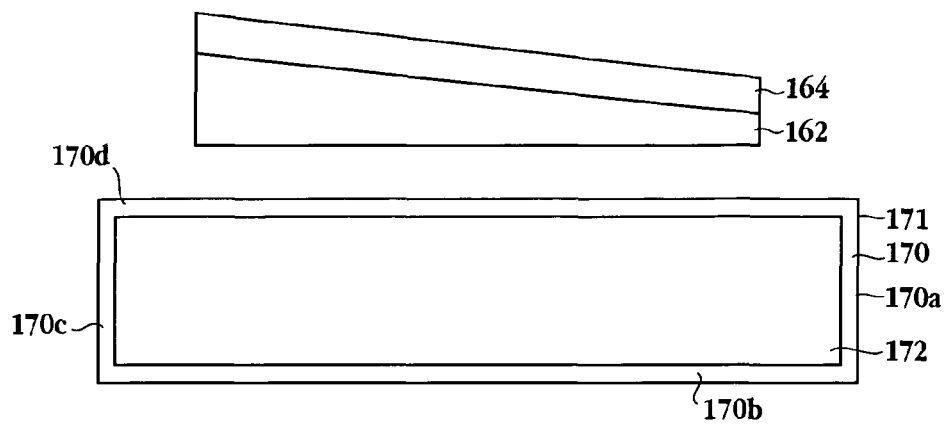
FIG. 6 is a simplified schematic diagram illustrating a substrate resting on a compliant chuck in accordance with one embodiment of the invention.

FIG. 6 is a simplified schematic diagram illustrating a substrate resting on a compliant chuck in accordance with one embodiment of the invention. The substrate, which includes silicon substrate layer 162 and copper layer 164 is disposed over compliant chuck 171. Compliant chuck 171 includes a membrane 170 surrounding fluid 172. In one embodiment, fluid 172 is a magnetorheological (MR) fluid or a MR polymer. In another embodiment, membrane 170 includes rigid sides 170a and 170c, rigid bottom 170b and membrane 170d, also referred to as a bladder, is disposed on the top. Thus, in either case, when the MR fluid is in a compliant state, the substrate will sink into the compliant chuck.

It should be appreciated that a MR fluid or MR polymer is a class of controllable fluids or polymers that have rheological properties which may be rapidly varied by the application of a magnetic field. MR fluids are suspensions of micron-sized magnetically polarizable particles in a liquid. MR polymers are magnetically polarizable particles or functional groups on a polymer backbone. Exposure to a magnetic field, or an electromagnetic field, transforms the fluid or compliable polymer into a plastic-like solid in milliseconds. The interactions between the resulting induced dipoles causes the particles or functional groups to form chain-like structures parallel to the field, which increases the resistance of the MR fluid to flow, or the MR polymer to deform. Removal of the magnetic field allows the fluid to return to its original free-flowing liquid state, or in the case of the MR polymer, its previous compliant state. In one embodiment, the degree of change in the MR fluid depends on the magnitude of the applied field.

Figure 7:
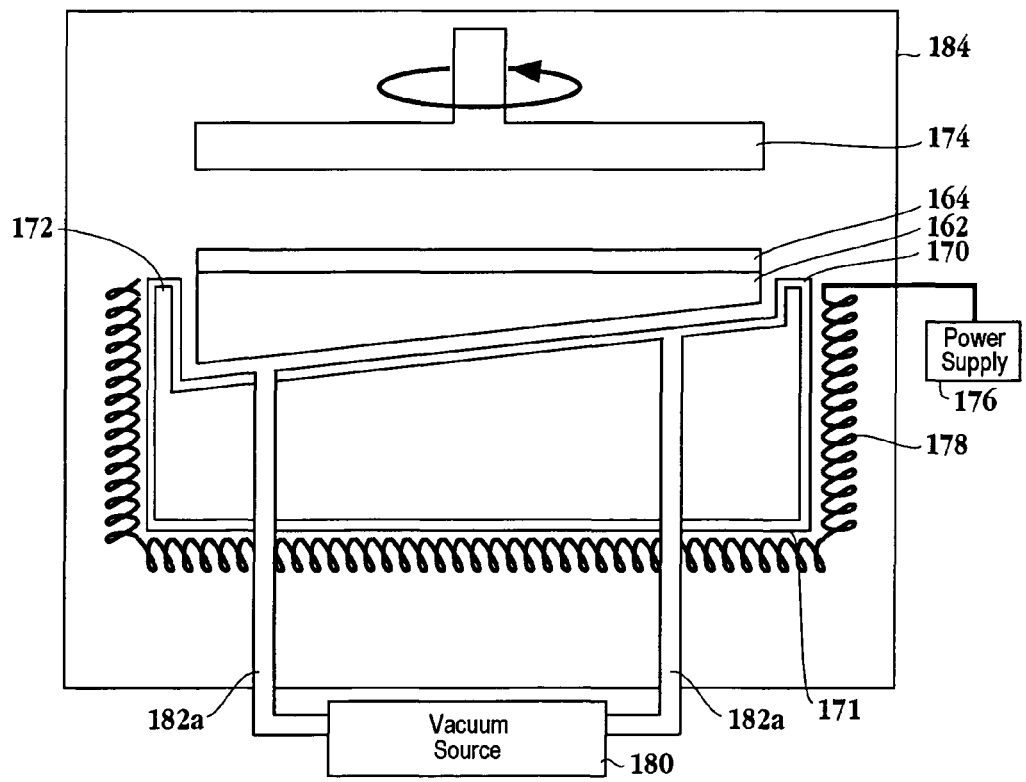
FIG. 7 is a simplified schematic diagram illustrating a semiconductor processing module having a compliant chuck in accordance with one embodiment of the invention.

FIG. 7 is a simplified schematic diagram illustrating a semiconductor processing module having a compliant chuck in accordance with one embodiment of the invention. Here, processing module 184 includes compliant chuck 171 having outer membrane 170 which is filled with MR fluid 172. It should be appreciated that MR fluid 172 may be a MR polymer. The substrate, which includes silicon substrate layer 162 and copper layer 164, has been forced down into compliant chuck 171. This may be achieved through use of grinding wheel 174 pressing down on the silicon substrate. Thus, the substrate has been oriented to align with the grinding wheel 174 while the chuck is in a compliant state. Once the substrate has been aligned, an electromagnetic field may be applied proximate to the compliant chuck 171 through power supply 176 and electromagnets 178.

The application of the electromagnetic field causes the MR fluid or MR polymer 172 to become rigid. Thus, the substrate is now supported by chuck 171 in a rigid state. It should be appreciated that electromagnets 178 may be positioned behind or within the MR fluid-filled membrane. Additionally, a vacuum source 180 in communication with the bottom of the substrate through channels 182a and 182b may be used to further support the substrate during a grinding operation. Alternatively, a semi-conductive polymer material may be applied to the top surface of the compliant chuck, which allows the chuck to be used as an electrostatic chuck in order to hold the substrate in place during a processing operation.

Figure 8:
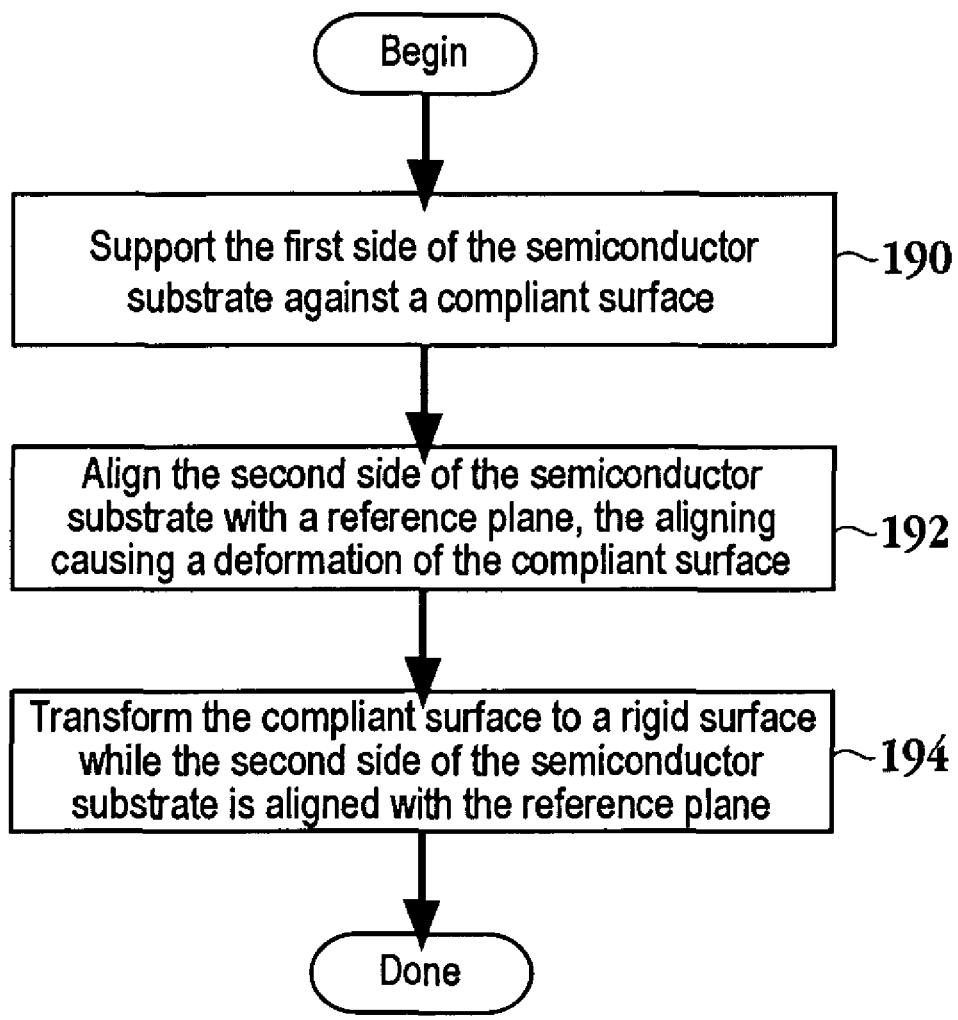
FIG. 8 is a flow chart diagram illustrating the method operations for supporting a semiconductor substrate during a processing operation in accordance with one embodiment of the invention.

FIG. 8 is a flow chart diagram illustrating the method operations for supporting a semiconductor substrate during a processing operation in accordance with one embodiment of the invention. The method initiates with operation 190 where the first side of a semiconductor substrate is supported against a compliant surface. Here, the substrate may be disposed over a compliant chuck as discussed above with reference to FIGS. 6 and 7. The method then advances to operation 192 where the second side of the semiconductor substrate, which opposes the first side, is aligned with a reference plane. As illustrated with reference to FIGS. 6 and 7, this alignment causes a deformation of the compliant surface. Here, the substrate sinks into the compliant chuck. As mentioned above, a grinding wheel or some other suitable reference plane may be used to align the substrate. The method then proceeds to operation 194 where the compliant surface is transformed to a rigid surface while the second side of the semiconductor substrate is aligned with a reference plane. Thus, once the substrate is aligned with a reference plane by forcing the substrate down into the compliant surface, an electromagnetic field may be activated in order to transform the MR fluid from a compliant state to a rigid state.

One skilled in the art will appreciate that the substrate may be held in place through any suitable means and is not limited to the use of vacuum to hold the substrate. For example, a semi-conductive polymer material may be applied to the top surface of the compliant chuck. Thus, the semi-conductive polymer material enables the chuck to be used as an electrostatic chuck to further support the substrate. It should be appreciated that the compliant chuck described above enables taking advantage of both a rigid structure and a flexible structure. That is, compliance with a non-rigid membrane is achieved and once set in place it is frozen. Furthermore, these embodiments allow for the reduction of site variation, thereby allowing less introduction of non-uniformity through the long-range planarization operation. In other words, the grinding pre-planarization step described herein reduces the total thickness variation of the wafer to the front side and eliminates taper by absorbing the taper in the MR fluid. Thus, the pre-planarization, i.e., long range planarization, is completed with reduced non-uniform removal of the copper layer.

Figure 9:
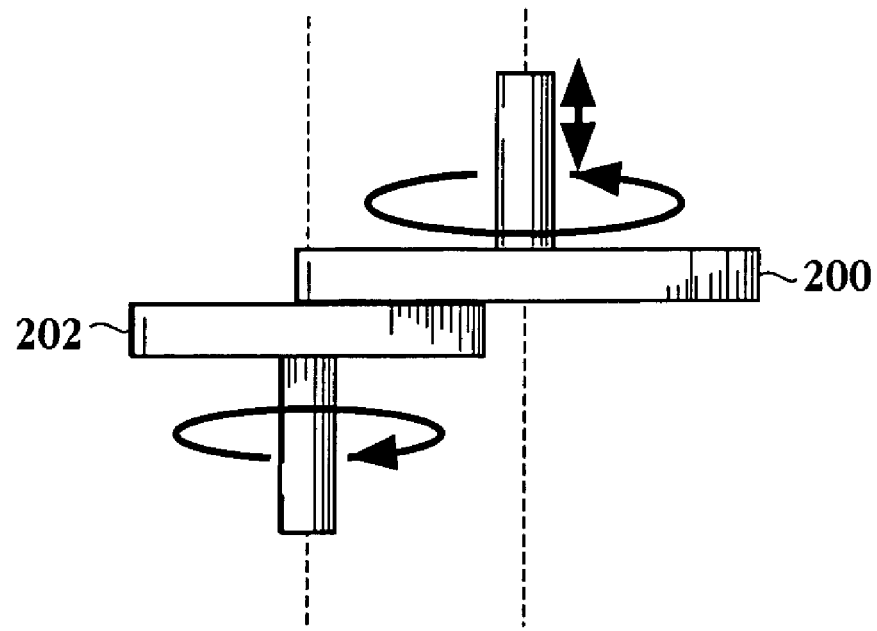
FIG. 9 is a simplified schematic diagram illustrating a grinding wheel being applied to a supported substrate in accordance with one embodiment of the invention.

FIG. 9 is a simplified schematic diagram illustrating a grinding wheel being applied to a supported substrate in accordance with one embodiment of the invention. Here, grinding wheel 200 is being rotated while in contact with a substrate supported on substrate support 202. An axis of grinding wheel 200 is offset from an axis of substrate support 202. Grinding wheel 200 may move in a direction that is perpendicular to a top surface of substrate support 202, as well as a parallel direction to the top surface of substrate support 202. Additionally, it should be appreciated that grinding wheel 200 and substrate support 202 are rotating in the same direction. It should be appreciated that minimal down force needs to be applied to grinding wheel 200 during the grinding operation.

Figure 10:
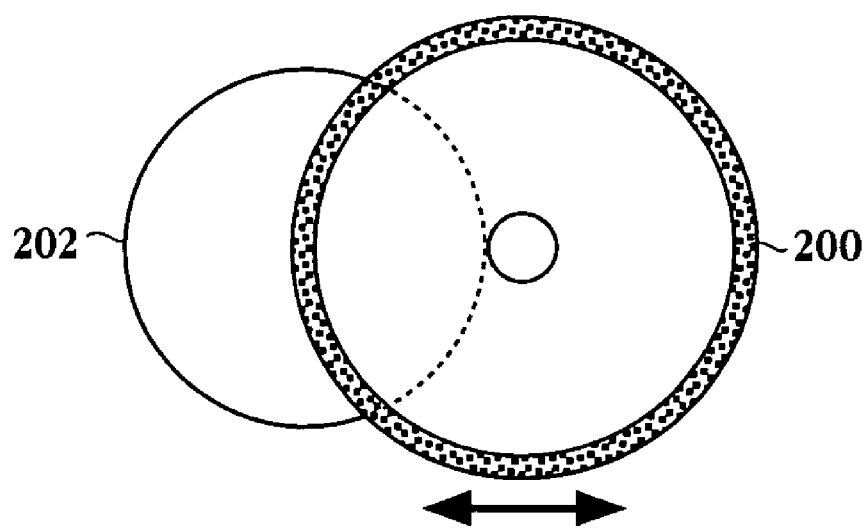
FIG. 10 is a top view of the grinding wheel and substrate support illustrated in FIG. 9.

FIG. 10 is a top view of the grinding wheel and substrate support illustrated in FIG. 9. Here, grinding wheel 200 is an annular ring in which grinding teeth are attached to one surface of the annular ring in order to perform the planarization operation. It should be appreciated that in the configuration described with respect to FIGS. 9 and 10, grinding wheel 200 moves radially over the surface of a substrate supported in substrate support 202. Furthermore, this configuration enables the grinding wheel to contact a portion of the substrate rather than having to contact the entire surface of the substrate at once. This reduces the total stress applied to the wafer at any one time and reduces risk of substrate damage, especially with regards to low-K dielectric films.

Figure 11:
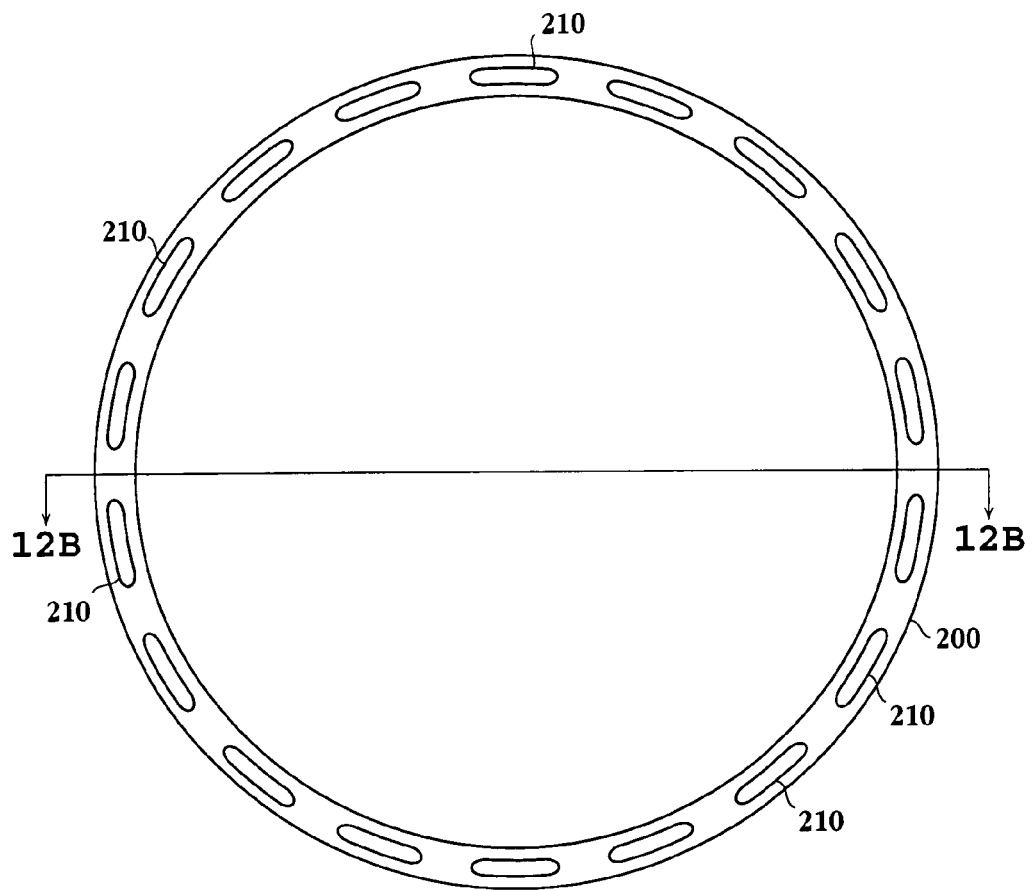
FIG. 11 is a simplified schematic diagram illustrating a bottom view of the grinding wheel in accordance with one embodiment of the invention.

FIG. 11 is a simplified schematic diagram illustrating a bottom view of the grinding wheel in accordance with one embodiment of the invention. Here, grinding wheel 200 includes a plurality of teeth 210 segmented over the annular ring of the grinding wheel. In one embodiment, the teeth 210 on the wheel are made compliant by cementing the teeth onto a compliant intermediate layer. This compliant intermediate layer may be a polymer material, for example, polyurethane, rubber, etc. Alternatively, teeth 210 may be attached to a fluid filled bladder, with the fluid being selected to provide compliance as necessary. For example, the MR fluid described above may be used in the bladder in order for the compliant material to be able to alternate between a compliant state and a rigid state. It should be appreciated that the use of a compliant layer would enable the teeth to better follow the contours of the wafer while still providing a planarization length equal to the size of the individual teeth attached to the compliant material on the annular ring of grinding wheel 200. That is, the compliancy provides better contour following, but the rigid teeth provide the long-range planarization for normalization of the substrate surface. One skilled in the art will appreciate that where the compliant layer includes a MR fluid, a power supply and electromagnets similar to the power source and electromagnets of FIG. 7 will be included.

Figure 12A:
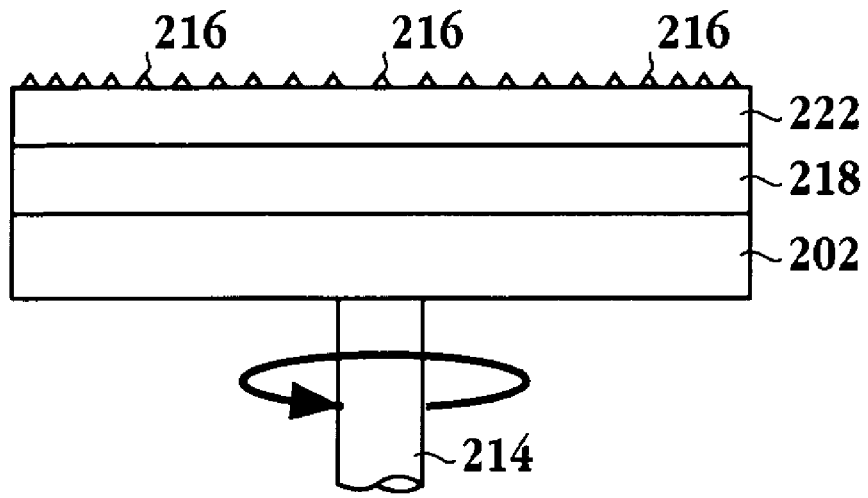
FIGS. 12A and 12B are alternative configurations of the grinding wheel illustrated in FIG. 11.
Figure 12B:
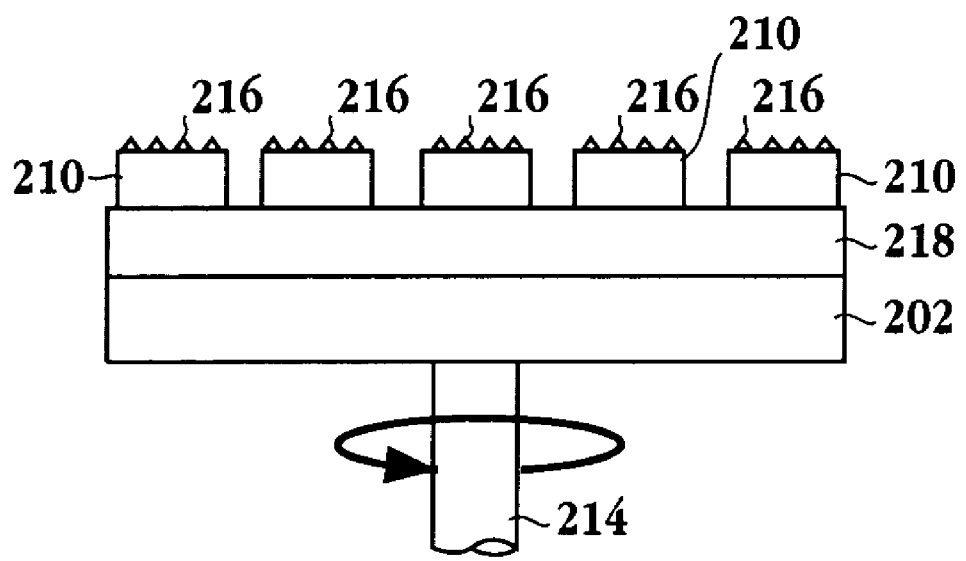

FIGS. 12A and 12B are alternative configurations of the grinding wheel illustrated in FIG. 11. The grinding wheel of FIG. 12A includes a matrix layer 222 disposed over compliant layer 218 which is disposed over annular ring 220. Matrix layer 222 may be composed of a metal composite or polymer resin material such as that used by NORTON/ST. GOBAIN in their respective abrasive grinding wheels. Shaft 214 is interconnected with annular ring 220 in order to rotate the annular ring. Protrusions 216 may be a diamond abrasive supported in matrix layer 222. In one embodiment, protrusions 216 protrude from a surface of matrix layer 222 by approximately one micron. In another embodiment, the diamond size is approximately three microns. In FIG. 12A the matrix is a continuous layer over the annular ring. Alternatively, in FIG. 12B the teeth may be segmented as illustrated with reference to FIG. 11. In one embodiment, annular ring 220 is composed of stainless steel.

Figure 12C:
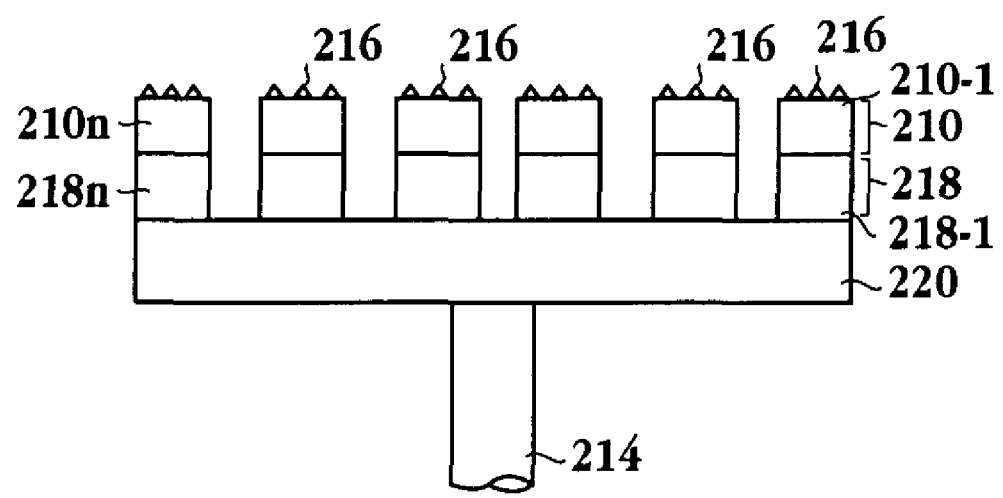
FIG. 12C illustrates yet another alternative embodiment to the grinding wheel of FIGS. 12A and 12B.

FIG. 12C illustrates yet another alternative embodiment to the annular ring of FIGS. 12A and 12B. Here, compliant layer 218 of FIGS. 12A and 12B is segmented into compliant segments 218-1 through 218-n. In one embodiment, there is a one-to-one relationship between teeth 210-1 through 210-n and compliant segments 218-1 through 218-n of compliant layer 218. However, it should be appreciated that more than one tooth may be associated with a single compliant layer segment. One skilled in the art will appreciate that compliant layer 218 may be bonded to annular ring 220 through any suitable means such as, for example, through the use of an adhesive. In addition, teeth 210 may be affixed to compliant layer 218 through any suitable means currently available. It should be appreciated that where compliant layer 218 incorporates MR fluid, a magnetic field may be applied to compliant layer 218 through the incorporation of electromagnets either in or around compliant layer 218, similar to electromagnet around the compliant chuck of FIG. 7. The grinding wheel of FIGS. 12A-C may be dressed. That is, as processing occurs protruding diamonds 216 may wear over time. Thus, in order to further expose the diamonds, a dressing wheel or disk (such as a ceramic disk) is used to remove some of the matrix in which the diamonds are contained to expose additional diamonds (dress the wheel) or further expose protruding diamonds.

Figure 13:
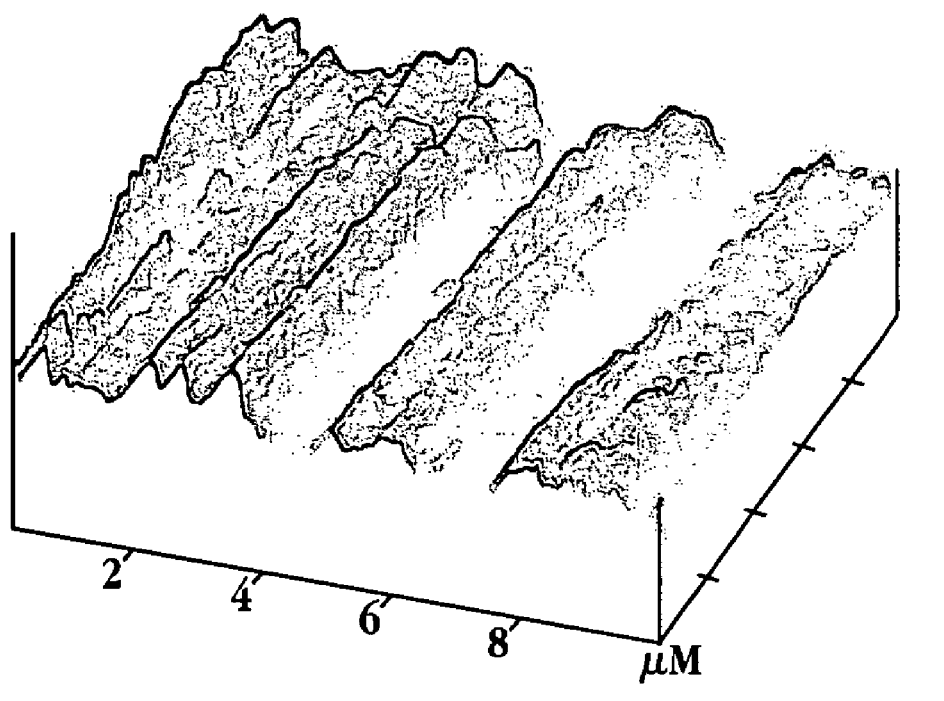
FIG. 13 is a pictorial representation of an atomic force microscopy (AFM) analysis of a substrate surface after the completion of a pre-planarization process.

FIG. 13 is a pictorial representation of an atomic force microscopy (AFM) analysis of a substrate surface after the completion of a pre-planarization process. As can be seen, the pre-planarization process, i.e., grinding process, will result in a number of scratches across the surface of the substrate. According to this AFM analysis, the scratch depth is approximately 0.2 microns and the width is approximately 2 microns. It should be appreciated that this type of topography configuration is optimal for a short-range planarization technique which will follow the pre-planarization technique that introduced these scratches. In essence, the long rage planarization creates a new pattern that is independent of the incoming topography, i.e., the wafers look the same coming out of the grinding or pre-planarization process. Furthermore, the scratches depicted in FIG. 13 may be thought of as small trenches which a short range planarization process is optimized to remove. Of course, the scratch depth is less than the thickness of the copper layer in order to guarantee that enough copper remains to allow planarization of the intermediate surface produced during the pre-planarization step.

Figure 14:
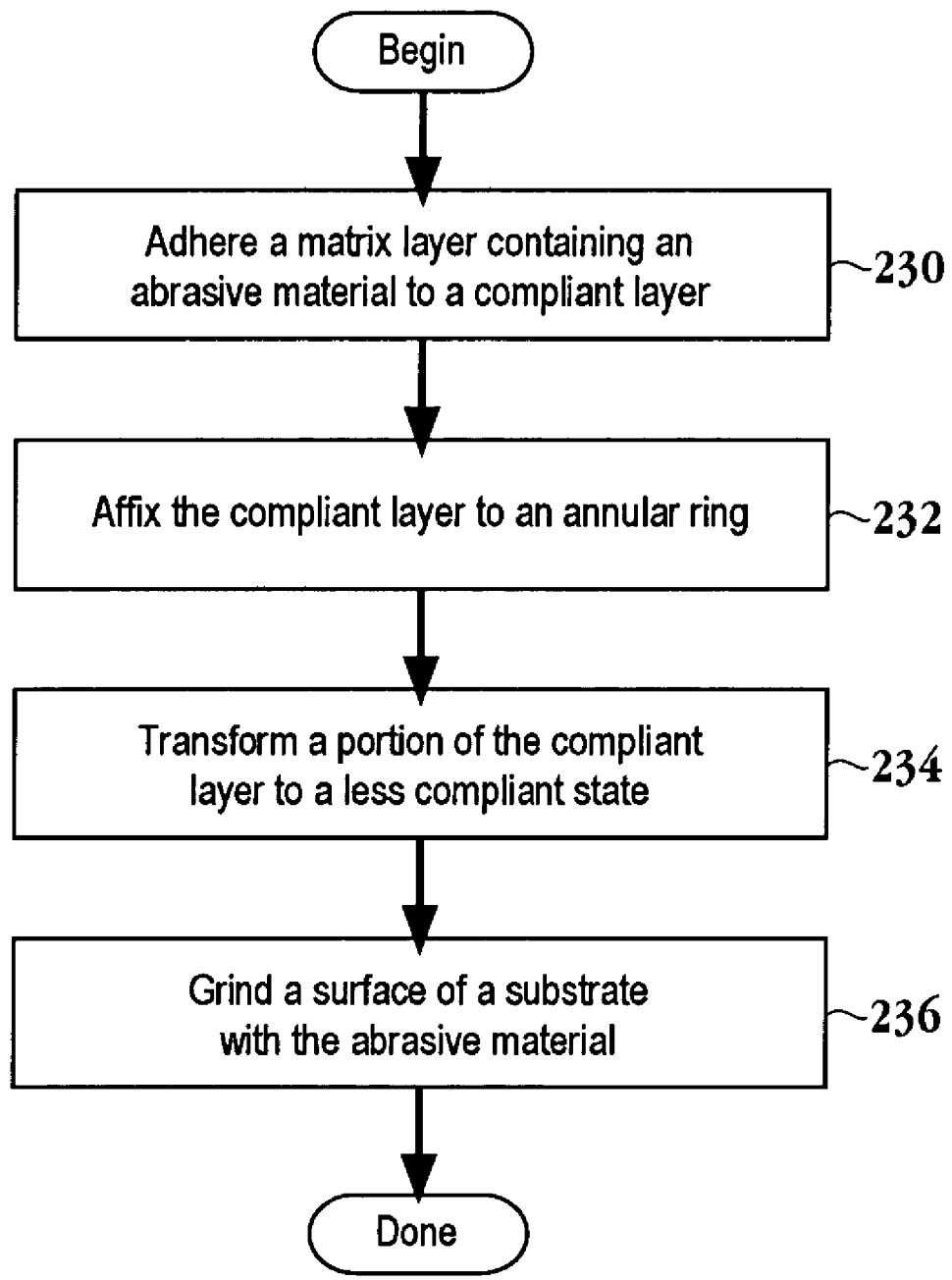
FIG. 14 is a flow chart diagram illustrating the method operations for performing a planarization process in accordance with one embodiment of the invention.

FIG. 14 is a flow chart diagram illustrating the method operations for performing a planarization process in accordance with one embodiment of the invention. The method initiates with operation 230 where a matrix layer containing an abrasive material is adhered to a compliant layer. The abrasive material here may be diamonds as mentioned above. The method then advances to operation 232 where the compliant layer is affixed to an annular ring. Here, the compliant layer may be a polymer such as polyurethane, rubber, etc. Alternatively the compliant layer may be a membrane surrounding a fluid, such as MR fluid. The method then proceeds to operation 234 where a portion of the compliant layer is transformed to a less compliant state. Here, the application of an electromagnetic field proximate to the compliant layer may cause the MR fluid to become more rigid and less compliant, i.e., the fluid becomes more viscous. Thus, the planarization length may be manipulated through this transformation. The method then includes grinding a surface of the substrate with the abrasive material. Here, small scratches will be introduced into the surface of the substrate which will eventually be removed through a subsequent short range planarization process. The grinding wheel of FIGS. 9 through 12C may be used to carry out the method described herein. It should be appreciated that the power supply of FIG. 7 may be coupled to an electromagnetic generator that is proximate to the compliant layer of the grinding wheel of FIG. 11. Alternatively, the electromagnetic generator, e.g., electromagnets, may be embedded in the annular ring of the grinding wheel proximate to the compliant layer.

In summary, the above-described invention provides a method and apparatus for normalizing a wafer surface in order to standardize a downstream CMP process by decoupling the long-range planarization from short-range planarization. A grinding process having a planarization length associated with a die-size scale, i.e., on the order of millimeters is used to normalize a wafer surface. The grinding process leaves scratches in the surface as described above. These scratches are subsequently removed by a short-range planarization process. Because the wafer surfaces incoming to the short-range planarization process are normalized, a single standardized design may be used for the short range planarization process (having a scale on the order of microns). In addition, this standardization enables the use of abrasive-free slurries to complete the planarization. The wafer could then use a plasma etch to remove the barrier, or if a partial planarization was performed on these wafers using conventional slurry, a plasma etch-back of the pre-planarized copper from the second step and a final barrier removal.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for producing a normalized surface on a substrate for a chemical mechanical planarization process, comprising the operations of:
    defining a representative distance between protrusions extending from the surface of the substrate;
    grinding a surface of the substrate with a first surface having a first planarization length corresponding to the representative distance, the first surface having compliant grinding teeth; and
    planarizing the surface of the substrate with a second surface having a second planarization length, the second planarization length being less than the first planarization length.

2. The method of claim 1, wherein the first planarization length is greater than 200 millimeters.

3. The method of claim 1, wherein the method operation of grinding a surface of the substrate with a first surface having a first planarization length includes,
    substantially removing super-filled regions from the surface of the substrate; and
    producing scratches having a depth of less than about 0.25 microns and a width of less than about 2 microns in the surface of the substrate when removing the super-filled regions.

4. The method of claim 1, wherein the method operation of grinding a surface of the substrate with a first surface having a first planarization length includes,
    transforming super-filled regions on the surface of the substrate to trench regions.

5. The method of claim 1, wherein the method operation of planarizing the surface of the substrate with a second surface having a second planarization length includes,
    applying an abrasive-free slurry to the surface of the substrate; and
    planarizing the surface of the substrate with the abrasive free slurry until a layer on the surface of the substrate is removed.

6. The method of claim 1, wherein the first planarization length and the second planarization length represent distances between super-filled regions and trench widths, respectively.

7. The method of claim 1, wherein the first planarization length is between about 100 and about 200 millimeters.

8. The method of claim 1, wherein the compliant grinding teeth are composed of diamonds protruding from a compliant layer.

* * * * *